US012149211B2

(12) United States Patent
Lo et al.

(10) Patent No.: US 12,149,211 B2
(45) Date of Patent: *Nov. 19, 2024

(54) WIRELESS RECEIVER

(71) Applicant: Taiwan Semiconductor Manufacturing Co., Ltd., Hsin-Chu (TW)

(72) Inventors: An-Hsun Lo, Hsin-Chu (TW); Wen-Sheng Chen, Hsin-Chu (TW); En-Hsiang Yeh, Hsin-Chu (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,580

(22) Filed: Aug. 8, 2022

(65) Prior Publication Data

US 2022/0385251 A1 Dec. 1, 2022

Related U.S. Application Data

(63) Continuation of application No. 17/063,171, filed on Oct. 5, 2020, now Pat. No. 11,456,710, which is a
(Continued)

(51) Int. Cl.
*H03F 3/45* (2006.01)
*H03F 1/34* (2006.01)
(Continued)

(52) U.S. Cl.
CPC ............ *H03F 1/342* (2013.01); *H03F 1/565* (2013.01); *H03F 3/193* (2013.01);
(Continued)

(58) Field of Classification Search
CPC .......... H03F 1/342; H03F 1/565; H03F 3/193; H03F 3/45179; H03F 3/45264;
(Continued)

(56) References Cited

U.S. PATENT DOCUMENTS

| 5,613,233 | A  | 3/1997  | Vagher        |
| 6,577,219 | B2 | 6/2003  | Visser        |
| 7,039,381 | B2 | 5/2006  | Yang          |
| 7,323,935 | B2 | 1/2008  | Yang          |
| 7,521,996 | B2 | 4/2009  | Kluge         |
| 7,834,690 | B2 | 11/2010 | Aram          |
| 7,948,322 | B2 | 5/2011  | Lee           |
| 8,279,008 | B2 | 10/2012 | Hsieh et al.  |
| 8,427,240 | B2 | 4/2013  | Hsieh et al.  |

(Continued)

OTHER PUBLICATIONS

Zhuo, W. et al., "A Capacitor Cross-Coupled Common-Gate Low-Noise Amplifier", IEEE Transactions on Circuits and Systems-II: Express Briefs, Dec. 2005, 52(12), pp. 875-879, Note: it can be found in parent case U.S. Appl. No. 17/063,171.

*Primary Examiner* — Andrea Lindgren Baltzell
*Assistant Examiner* — Khiem D Nguyen
(74) *Attorney, Agent, or Firm* — Duane Morris LLP

(57) ABSTRACT

A low noise amplifier (LNA) includes a pair of n-type transistors, each configured to provide a first transconductance; a pair of p-type transistors, each configured to provide a second transconductance; a first pair of coupling capacitors, cross-coupled between the pair of n-type transistors, and configured to provide a first boosting coefficient to the first transconductance; and a second pair of coupling capacitors, cross-coupled between the pair of p-type transistors, and configured to provide a second boosting coefficient to the second transconductance, wherein the LNA is configured to use a boosted effective transconductance based on the first and second boosting coefficients, and the first and second transconductances to amplify an input signal.

20 Claims, 6 Drawing Sheets

Related U.S. Application Data continuation of application No. 15/344,133, filed on Nov. 4, 2016, now Pat. No. 10,797,655.

(51) Int. Cl.
*H03F 1/56* (2006.01)
*H03F 3/193* (2006.01)

(52) U.S. Cl.
CPC ..... *H03F 3/45179* (2013.01); *H03F 3/45264* (2013.01); *H03F 3/45475* (2013.01); *H03F 2200/294* (2013.01); *H03F 2200/451* (2013.01); *H03F 2203/45018* (2013.01); *H03F 2203/45306* (2013.01)

(58) Field of Classification Search
CPC ........... H03F 3/45475; H03F 2200/294; H03F 2200/451; H03F 2203/45018; H03F 2203/45306; H03F 1/26; H03F 3/45076; H03F 3/45479; H04B 1/40
USPC ................. 330/277, 253, 254, 258
See application file for complete search history.

(56) References Cited

U.S. PATENT DOCUMENTS

| | | | |
|---|---|---|---|
| 8,593,206 | B2 | 11/2013 | Chen et al. |
| 8,610,494 | B1 | 12/2013 | Jin et al. |
| 8,618,631 | B2 | 12/2013 | Jin et al. |
| 8,816,766 | B2 * | 8/2014 | Igarashi .............. H03F 3/45183 330/261 |
| 8,912,581 | B2 | 12/2014 | Lin et al. |
| 8,941,212 | B2 | 1/2015 | Yen et al. |
| 9,184,256 | B2 | 11/2015 | Huang et al. |
| 9,209,521 | B2 | 12/2015 | Hung et al. |
| 9,537,457 | B2 | 1/2017 | Issakov |
| 10,797,655 | B2 | 10/2020 | Lo |
| 11,456,710 | B2 * | 9/2022 | Lo ........................... H03F 1/342 |
| 2007/0216481 | A1 | 9/2007 | Jiminez |
| 2010/0244961 | A1 * | 9/2010 | Saigusa ............... H03F 3/45183 330/253 |
| 2013/0057346 | A1 | 3/2013 | Riekki |
| 2014/0132333 | A1 | 5/2014 | Jin et al. |
| 2014/0253262 | A1 | 9/2014 | Hsieh et al. |
| 2014/0253391 | A1 | 9/2014 | Yen |
| 2015/0214900 | A1 | 7/2015 | Horng |
| 2015/0364417 | A1 | 12/2015 | Lee |

* cited by examiner

WIRELESS RECEIVER

CROSS-REFERENCE TO RELATED APPLICATION

This application is a continuation of U.S. patent application Ser. No. 17/063,171, filed Oct. 5, 2020, which is a continuation of U.S. patent application Ser. No. 15/344,133, filed Nov. 4, 2016, now U.S. Pat. No. 10,797,655 each of which are incorporated by reference herein in their entireties.

BACKGROUND

Bluetooth (BT) is a short-range radio standard intended to replace the cables connecting portable and fixed electronic devices. The standard, which operates in the unlicensed Industrial-Scientific-Medical ("ISM") band at 2.4 GHz, focuses on robustness, low complexity, low power, and low cost. In recent years, Bluetooth Low Energy (BLE) was proposed for the use of applications that desire even lower power consumption. With the ever-increasing needs in applications of Internet of Things (IoT) and Machine to Machine (M2M), optimized BT and/or BLE receivers (hereinafter "wireless receiver") to achieve various design goals (e.g., a low power consumption, a high linearity, etc.) are equally desired.

In general, a wireless receiver includes a plurality of circuit components, or circuits, coupled to one another to perform one or more desired functionalities such as, for example, receiving a signal wirelessly through an antenna and processing the signal with a minimum distortion. Among the plurality of circuits, a low noise amplifier (LNA) is typically coupled to the antenna and, accordingly, referred to as one of the front-end circuits of the receiver. Such an LNA is generally configured to amplify a data signal received by the antenna without amplifying a noise signal accompanied with the data signal. In this regard, the LNA is designed to have a high-enough (power) gain and a low noise figure, i.e., a high signal-to-noise ratio (SNR). Conventional LNA's commonly sacrifices valuable real estate on an integrated circuit and/or consumes substantially large power to achieve the above-mentioned design goals, i.e., the high gain and low noise figure. Thus, the conventional LNA's are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

The present disclosure provides various embodiments of a wireless receiver that includes a low noise amplifier (LNA) circuit. In accordance with some embodiments, the disclosed LNA circuit provides a boosted effective transconductance to amplify a received signal without concurrently increasing a power consumption. More specifically, by using either a complimentary common-gate circuit design or a complimentary cross-coupled capacitor circuit design to implement the LNA circuit in accordance with some embodiments, the disclosed LNA circuit may increase/boost an effective transconductance so that in spite of operating under a regular "mode" (i.e., keeping the power consumption at a regular level), the LNA circuit can still use the boosted effective transconductance to efficiently amplify the signal and keeps the noise figure at a substantially low level (i.e., a high signal-to-noise ratio (SNR)). Further, because of using either of the above-mentioned circuit designs, two inductors included in the LNA circuit that is used to further reduce the noise figure can be allocated to share a same area on the integrated circuit. As such, the area used for fabricating the LNA circuit may be advantageously minimized.

Figure 1:
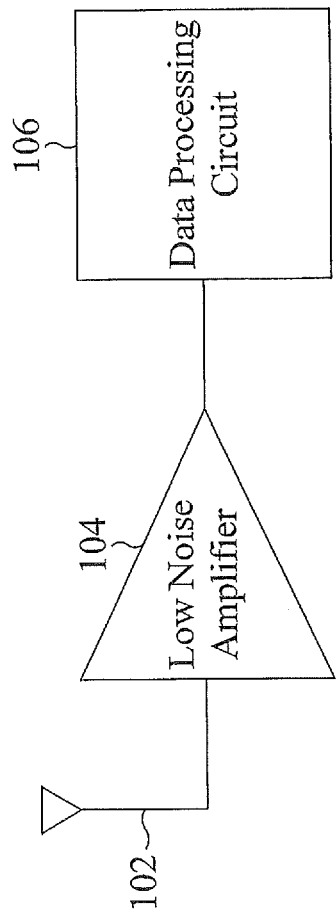
FIG. 1 illustrates an exemplary block diagram of a wireless receiver, in accordance with some embodiments.

FIG. 1 illustrates an exemplary block diagram of a wireless receiver 100, in accordance with various embodiments. As shown, the wireless receiver 100 includes an antenna 102, a low noise amplifier (LNA) circuit 104, and a data processing circuit 106. In some embodiments, the wireless receiver 100 is configured to be used in BT/BLE applications. For example, the wireless receiver 100 may be integrated into any of a variety of BT/BLE devices such as, for example, a health condition monitor, an industrial monitoring sensor, a geography-based targeted promotion (e.g., iBeacon), etc.

In some embodiments, the antenna 102 is configured to receive a (modulated) signal that is wirelessly transmitted from a transmitter. The LNA circuit 104, coupled to the antenna, is configured to amplify the modulated signal to a desired power/voltage level. In some alternative embodiments, there may be one or more circuit components, for example, a filter, a mixer, an oscillator, etc., coupled between the antenna 102 and the LNA circuit 104. The data processing circuit 106 is configured to process the amplified signal, and, in some embodiments, may include one or more circuit components such as, for example, a mixer, an oscillator, a demodulator, a filter, an analog-to-digital converter, and a combination thereof. In some embodiments, the data processing circuit 106 may be configured to provide the processed signal to a coupled module/device/unit for any of a variety of wireless (e.g., radio frequency) applications.

Figure 2A:
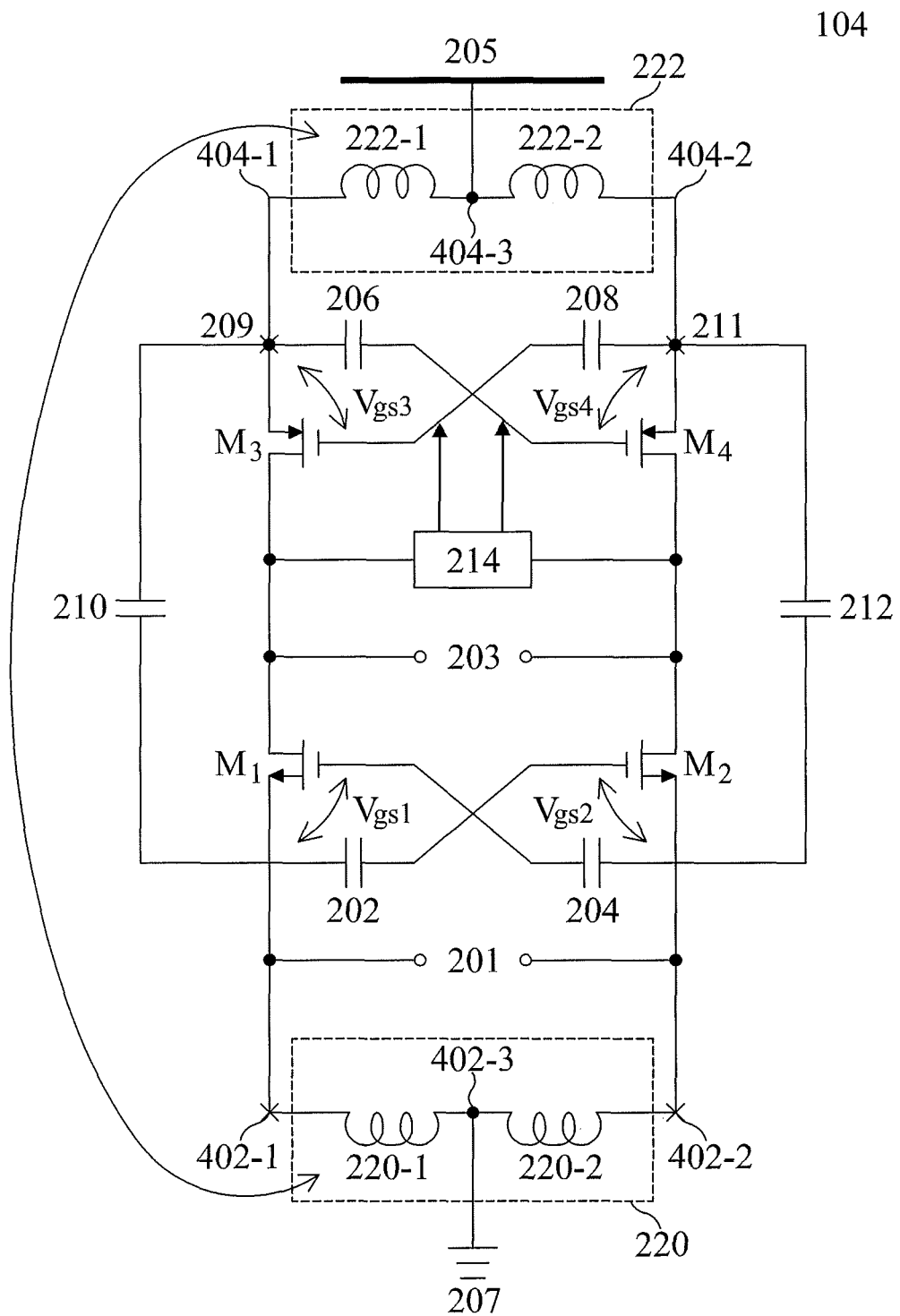
FIG. 2A illustrates an exemplary circuit diagram of a low noise amplifier of the wireless receiver of FIG. 1, in accordance with some embodiments.
Figure 2B:
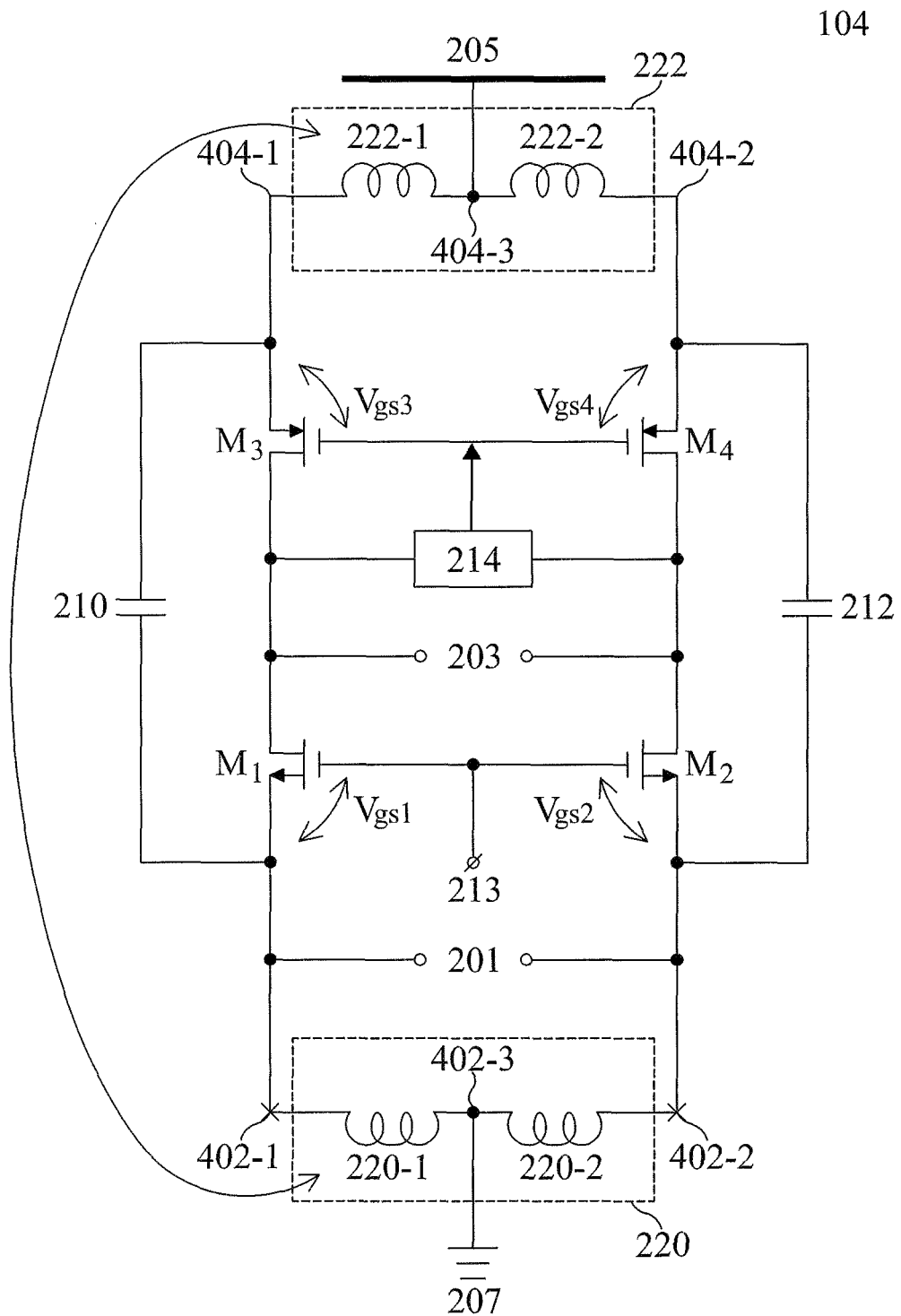
FIG. 2B illustrates another exemplary circuit diagram of the low noise amplifier of the wireless receiver of FIG. 1, in accordance with some embodiments.

FIGS. 2A and 2B illustrate two exemplary block diagrams of the LNA circuit 104, respectively, in accordance with various embodiments. In some embodiments, the LNA 104 is configured to receive a differential input signal (e.g., 201) and amplify the input signal to provide a differential output signal (e.g., 203). More specifically, in the illustrated embodiment of FIG. 2A, the LNA circuit 104 includes four transistors $M_1$, $M_2$, $M_3$, and $M_4$ wherein each of the transistors $M_1$ and $M_2$ includes an n-type metal-oxide-semiconductor field-effect-transistor (NMOSFET) and each of the transistors $M_3$ and $M_4$ includes a p-type metal-oxide-semiconductor field-effect-transistor (PMOSFET). However, each of the four transistors $M_1$-$M_4$ may be implemented by any of a variety of transistors such as, for example, a bipolar junction transistor (BJT), a high-electron-mobility transistor (HEMT), etc., while remaining within the scope of the present disclosure.

In some embodiments, the transistors $M_1$ and $M_2$ may form a first differential amplifier, and the transistors $M_3$ and $M_4$ may form a second differential amplifier. However, in some alternative embodiments, the transistors $M_1$ and $M_3$ may form a single-end amplifier, and the transistors $M_2$ and $M_4$ may form another single-end amplifier. As such, the transistor $M_1$ may be coupled to the transistor $M_3$ at the transistors $M_1$'s and $M_3$'s respective drain ends, and the transistor $M_1$ is configured to receive an input signal (e.g., 201) at its source end and output an amplified output signal (e.g., 203) at its drain end.

In some embodiments, the LNA circuit 104 further includes plural capacitors: 202, 204, 206, 208, 210, and 212. The capacitors 202, 204, 206, and 208 are substantially similar to one another, and each cross-coupled between a differential amplifier, in accordance with some embodiments. As such, the transistors $M_1$-$M_4$, and the cross-coupled capacitors 202, 204, 206, and 208 may cause the LNA circuit 104 to form a complimentary cross-coupled capacitor circuit. More specifically, the capacitors 202 and 204 are each cross-coupled between the first differential amplifier that includes the transistors MI and M2; and the capacitors 206 and 208 are each cross-coupled between the second differential amplifier includes the transistors $M_3$ and $M_4$. Thus, the capacitors 202, 204, 206, and 208 are each referred to as "cross-coupled capacitors ($C_c$)" hereinafter. More specifically, the $C_c$ 202 is coupled between a source end of the transistor $M_1$ and a gate end of the transistor $M_2$; the $C_c$ 204 is coupled between a source end of the transistor $M_2$ and a gate end of the transistor $M_1$; the $C_c$ 206 is coupled between a source end of the transistor $M_3$ and a gate end of the transistor $M_4$; the $C_c$ 208 is coupled between a source end of the transistor $M_4$ and a gate end of the transistor $M_3$.

In some embodiments, the capacitors 210 and 212 are substantially similar to each other. More specifically, in some embodiments, the capacitor 210 is coupled between a first common node coupled to the source end of the transistor $M_1$ and the $C_c$ 202, and a second common node coupled to the source end of the transistor $M_3$ and the $C_c$ 206; the capacitor 212 is coupled between a third common node coupled to the source end of the transistor $M_2$ and the $C_c$ 204, and a fourth common node coupled to the source end of the transistor $M_4$ and the $C_c$ 208. Further, in some embodiments, the capacitors 210 and 212 are each configured to block a direct-current (DC) signal and allow an alternating-current (AC) signal between the coupled transistors, and are thus each referred to as "DC blocking capacitor ($C_b$)" hereinafter. For example, the capacitor $C_b$ 210 is configured to allow an AC signal to flow between the source ends of the transistors $M_1$ and $M_3$, but block a DC signal to present between the source ends of the two transistors so as to keep bias voltages, respectively, at the source ends of the two transistors separated. Similarly, the capacitor $C_b$ 212 is configured to allow an AC signal to flow between the source ends of the transistors $M_2$ and $M_4$, but block a DC signal to present between the source ends of the two transistors so as to keep bias voltages, respectively, at the source ends of the two transistors separated.

In some embodiments, as shown, the LNA circuit 104 further includes a common-mode feedback (CMFB) circuit 214 coupled between the drain ends of the transistors $M_3$ and $M_4$. Such a CMFB circuit 214 is configured to provide a stable voltage to the coupled transistors $M_1$, $M_2$, $M_3$, and $M_4$ so as to assure the transistors LNA 104 can operate around a linear point. Two exemplary circuit diagrams and corresponding operations of the CMFB circuit 214 will be described in further detail with respect to FIGS. 3A and 3B, respectively.

In some embodiments, the LNA circuit 104 includes a first inductor 220 and a second inductor 222. The first inductor 220 and second inductor 222 may be configured to electromagnetically couple with each other to serve as a transformer. Consequently, such a transformer may cause an input impedance of the LNA circuit 104 to be matched with a generally accepted impedance value (e.g., about 40~50 ohm), and further provides an improved (e.g., a decreased) noise figure. In some embodiments, as shown, the first inductor 220 is coupled between the source ends of the transistors ($M_1$ and $M_2$) and voltage level 207 (e.g., ground), and the second inductor 222 is coupled between the source ends of the transistors ($M_3$ and $M_4$) and voltage level 205 (e.g., Vdd). In some embodiments, the first inductor 220 includes two sub-inductors 220-1 and 220-2 coupled to each other in series, with ground (207) coupled therebetween; the second inductor 222 includes two sub-inductors 222-1 and 222-2 coupled to each other in series, with Vdd (205) coupled therebetween, as shown in FIG. 2A. In some embodiments, the first and second inductors (220 and 222) are each implemented as a conductive coil, and the two conductive coils are physically interleaved with each other to form a transformer. Further, the transformer may include 6 ports: 402-1, 402-2, 402-3, 404-1, 404-1, 404-2, and 404-3, as shown in FIG. 2A. It is understood, however, that various numbers of ports are within the scope of the present disclosure. An exemplary layout design of the transformer will be provided and described in further detail below with respect to FIG. 4.

People with ordinary skill in the art understand that a transconductance of a transistor, defined as $I_d/V_g$, is an electric characteristic of the transistor to determine how much drain current ($I_d$) will flow through the transistor given a voltage ($V_g$) applied at a gate of the transistor. As such, the drain current ($I_d$) is positively proportional to the transconductance, and a power consumption of an LNA circuit comprising one or more such transistors is positively proportional to the drain current ($I_d$). Also, in general, a noise figure of the LNA circuit is inversely proportional to the transconductance(s). Accordingly, when the LNA circuit is designed, the transconductance is subjected to a variety of design limits. For example, if a transconductance of an LNA circuit is selected to be too large, although a drain current can be increased (e.g., a more responsive performance) and a noise factor can be suppressed, a power consumption, positively proportional to the drain current, may be accordingly enlarged. On the other hand, if the transconductance is selected to be too small, although the power consumption can be reduced, the performance may be less responsive and the noise figure may be accordingly increased.

In this regard, some embodiments of the LNA circuit 104 provide an effective transconductance, and further boost the effective transconductance through implementing the LNA circuit 104 by either a complimentary common-gate circuit design or a complimentary cross-coupled capacitor circuit design. Using such a boosted effective transconductance, the noise figure of the LNA circuit 104 can be substantially suppressed since the noise figure is inversely proportional to the boosted effective transconductance, while the power consumption of the LNA circuit 104 is simultaneously minimized (i.e., remains intact without increasing with the boosted effective transconductance) since the power consumption is positively proportional to the transconductance of the transistor(s) that constitute the LNA circuit 104 instead of the effective transconductance/boosted effective transconductance.

Referring again to FIG. 2A, in some embodiments, each of the transistors $M_1$-$M_4$ has a respective transconductance ($G_m$), as described above. More specifically, since the transistors $M_1$ and $M_2$ are substantially similar to each other, transistors $M_1$ and $M_2$ may share a common transconductance $G_{mn}$, and since the transistors $M_3$ and $M_4$ are substantially similar to each other, transistors $M_3$ and $M_4$ may share a common transconductance $G_{mp}$. By interconnecting the transistors $M_1$-$M_4$ and the capacitors 206-212 in the circuit design of FIG. 2A, an effective transconductance ($G_{meff}$) of the LNA circuit 104 may be boosted and derived as: $2(G_{mn}+G_{mp})$, which is about $4G_m$ since $G_{mn}$ and $G_{mp}$ are about the same, in accordance with various embodiments of the present disclosure. More specifically, as described above, the capacitor $C_b$ 210 is each configured to block a DC signal between the transistors $M_1$ and $M_3$. More specifically, the capacitor $C_b$ 210 is configured to block the DC signal between the source ends of the transistors $M_1$ and $M_3$, respectively, such that the input signal 201 is about the same as a voltage signal (209) at the source end of the transistor $M_3$, in accordance with some embodiments. Similarly, the coupling of the capacitor $C_b$ 212 between the source ends of the transistors $M_2$ and $M_4$, respectively, results in a voltage signal (211) to be about the same as the input signal 201. Consequently, the effective transconductance ($G_{meff}$) of the LNA circuit 104 may be derived as: $G_{mn}+G_{mp}$. Further, the capacitors $C_c$ 202 and 204 each provides the transistors $M_1$ and $M_2$ a boosting coefficient on its respective gate-to-source voltage, $V_{gs1}$ and $V_{gs2}$. In some embodiments, such a boosting coefficient is about 2. As such, the transconductance $G_{mn}$ may be accordingly boosted to $2G_{mn}$. Similarly, the capacitors $C_c$ 206 and 208 each provides the transistors $M_3$ and $M_4$ a boosting coefficient on its respective gate-to-source voltage, $V_{gs3}$ and $V_{gs4}$. Similarly, in some embodiments, such a boosting coefficient is about 2. As such, the transconductance $G_{mp}$ may be accordingly boosted to $2G_{mp}$. As such, the effective transconductance ($G_{meff}$) of the LNA circuit 104 may be boosted to $4G_m$, as described above.

In some embodiments, the exemplary circuit design of the LNA circuit 104 of FIG. 2B is substantially similar to FIG. 2A except that the circuit design of FIG. 2B does not include the cross-coupled capacitors 202, 204, 206, and 208. Accordingly, the gates of the transistors M1 and M2 are commonly coupled to voltage level 213 (e.g., a voltage level between Vdd and ground), and the gates of the transistors M3 and M4 are commonly coupled to an output voltage of the CMFB circuit 214. As such, the above-described boosting coefficient provided to each of the gate-to-source voltages, $V_{gs1}$, $V_{gs2}$, $V_{gs3}$, and $V_{gs4}$ may be about 1. Consequently, an effective transconductance ($G_{meff}$) of the LNA circuit 104 may be derived as: ($G_{mn}+G_{mp}$), which is about $2G_m$.

Figure 3A:
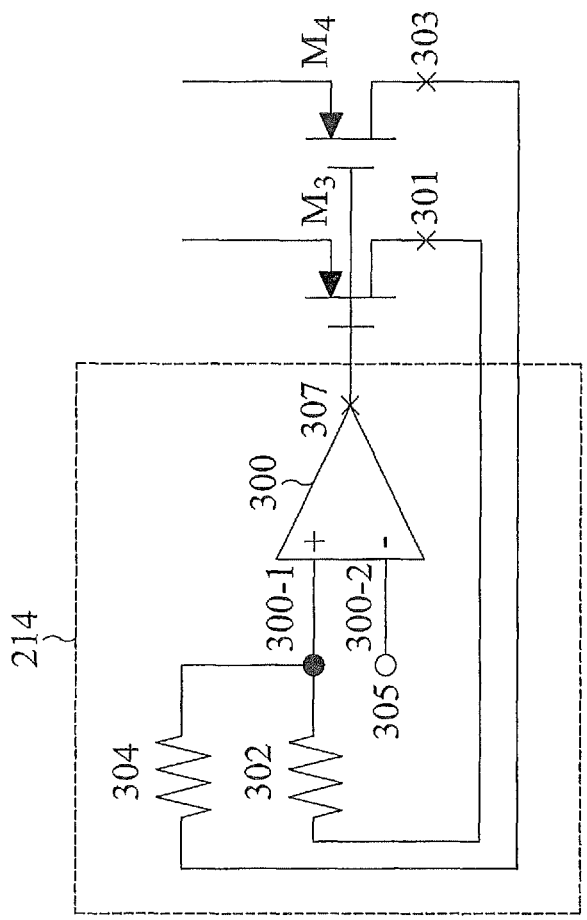
FIG. 3A illustrates an exemplary circuit diagram of a common-mode feedback circuit of the low noise amplifiers of FIGS. 2A and 2B, in accordance with some embodiments.
Figure 3B:
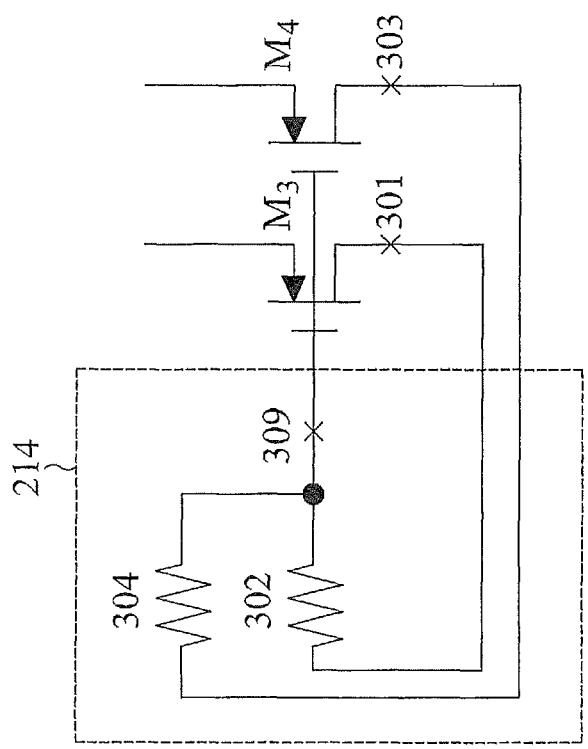
FIG. 3B illustrates another exemplary circuit diagram of the common-mode feedback circuit of the low noise amplifiers of FIGS. 2A and 2B, in accordance with some embodiments.

Referring now to FIGS. 3A and 3B, two exemplary circuit diagrams and of the CMFB circuit 214 are illustrated, respectively, in accordance with various embodiments. As shown in FIG. 3A, the CMFB circuit 214 includes an amplifier (e.g., an error amplifier) 300, and two resistors 302 and 304 commonly coupled to one input 300-1 of the amplifier 300. The other input 300-2 of the amplifier 300 is coupled to a reference voltage source and configured to receive a stable reference voltage 305. Further, the resistors 302 and 304 are each coupled to the drain end of the transistors $M_4$ and $M_3$, respectively. In some embodiments, the CMFB circuit 214 is configured to cause the voltages at the drain ends of the transistors $M_3$ and $M_4$, i.e., 301 and 303, to be about the same as the reference voltage 305 by equalizing a common-mode detected voltage, which is the voltage at the input 300-1, with the reference voltage 305. As such, an output voltage 307 of the amplifier 300 may be substantially close to the reference voltage 305, and accordingly, the voltages at 301 and 303 are each substantially equal to the stable reference voltage 305. Thus, the voltages at 301 and 303 are stabilized. The exemplary circuit diagram of FIG. 3B is substantially similar to FIG. 3A except that, in FIG. 3B, the CMFB circuit 214 does not include the amplifier 300. In some embodiments, operations of the CMFB circuit 214 of FIGS. 3A and 3B are substantially similar, i.e., stabilizing the voltages at 301 and 303. Thus, the operation of the CMFB circuit 214 of FIG. 3B is omitted.

Figure 4:
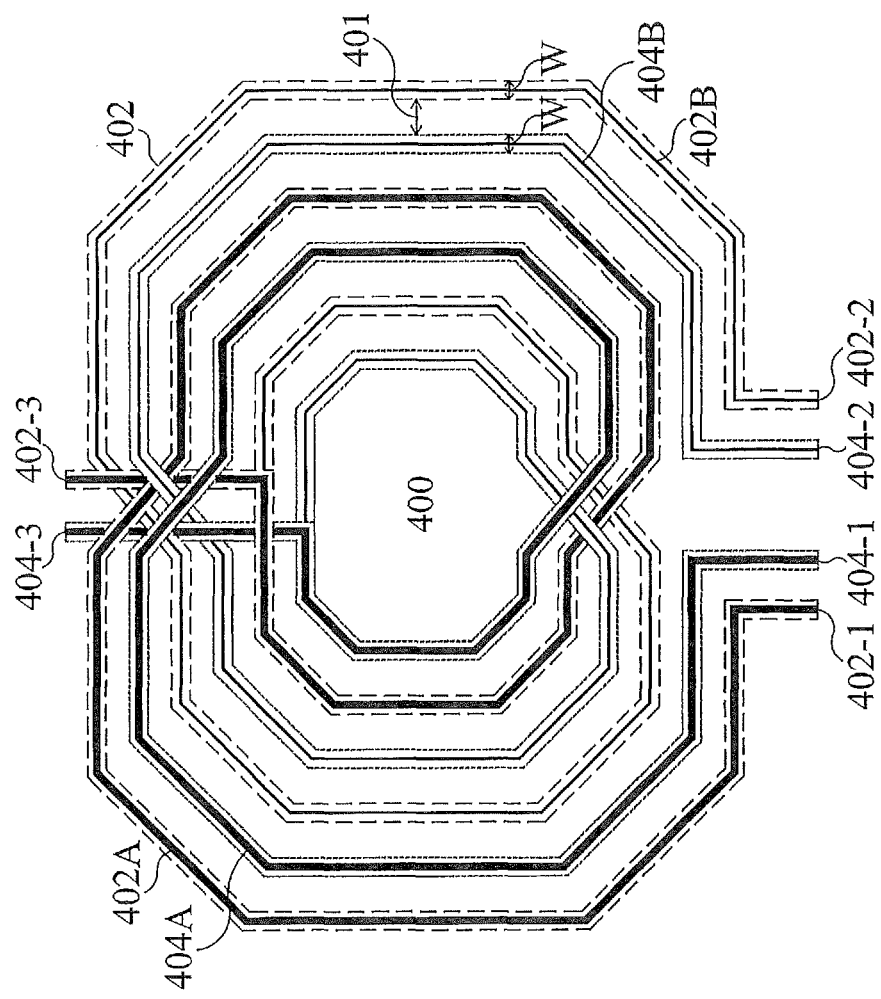
FIG. 4 illustrates an exemplary layout design of two conductive coils of the low noise amplifiers of FIGS. 2A and 2B, in accordance with some embodiments.

FIG. 4 illustrates an exemplary layout design of the above mentioned first and second conductive coils 402 and 404 that correspond to the inductors 220 and 222 (FIGS. 2A and 2B), respectively, in accordance with various embodiments. In some embodiments, the inductors 220 and 222 each includes an inductance that is defined by a configuration and a dimension of the respective conductive coil. Each conductive coil (e.g., 402 and 404) in the illustrated embodiment of FIG. 4 is formed as one or more routing lines, with a width "W" about 1~10 μm, in one or more loops, or coils, having conductive turns, wherein each loop is formed as an octagonal shape, hereinafter an "octagon-shaped loop." However, each loop may be formed as any of a variety of shapes such as, for example, a rectangular shape, a circular shape, a hexagonal shape, etc. In some embodiments, the conductive coils 402 and 404 are interleaved with each other and share a common lumen (e.g., 400). The term "lumen" used herein may be referred to as an hollow area on an integrated circuit where the conductive coils 402 and 404 are formed. In other words, the respective one or more "octagon-shaped" loops of the conductive coils 262 and 264 are overlapped to each other with a spacing (e.g., 401), which is about 2 µm, in accordance with some embodiments.

In some embodiments, as shown in the circuit diagrams of FIGS. 2A and 2B, each of the inductors 220 and 222 includes two sub-inductors (220-1 and 220-2) and (222-1 and 222-2) coupled to each other in series. Accordingly, the conductive coil 402 that defines the inductor 220 includes a first part of the conductive coil 402 (the solid line 402A) that corresponds to the sub-inductor 220-1, and a second part of the conductive coil 402 (the dotted line 402B) that corresponds to the sub-inductor 220-2. Similarly, the conductive coil 404 that defines the inductor 222 includes a first part of the conductive coil 404 (the solid line 404A) that corresponds to the sub-inductor 222-1, and a second part of the conductive coil 404 (the dotted line 404B) that corresponds to the sub-inductor 222-2.

As mentioned above, the conductive coils 402 and 404 (i.e., the inductors 220 and 222) are electromagnetically coupled (e.g., inductively coupled) to each other and thus form a transformer. In some embodiments, such a transformer is implemented as a 6-port transformer. More specifically, the transformer includes 6 ports: 402-1, 402-2, 402-3, 404-1, 404-2, and 404-3. According to some embodiments, referring still to FIG. 4 and in conjunction with FIGS. 2A-2B, the sub-inductor 220-1 (i.e., the solid line 402A of FIG. 4) is coupled between the source end of the transistor $M_1$ and ground (207) via the ports 402-1 and 402-3, respectively; the sub-inductor 220-2 (i.e., the dotted line 402B of FIG. 4) is coupled between the source end of the transistor $M_2$ and ground (207) via the ports 402-2 and 402-3, respectively; the sub-inductor 222-1 (i.e., the solid line 404A of FIG. 4) is coupled between the source end of the transistor $M_3$ and Vdd (205) via the ports 404-1 and 404-3, respectively; the sub-inductor 222-2 (i.e., the solid line 404B of FIG. 4) is coupled between the source end of the transistor $M_4$ and Vdd (205) via the ports 404-2 and 404-3, respectively. In some embodiments, disposing the conductive coils 402 and 404 as the transformer shown in FIG. 4 may provide a variety of advantages. For example, the conductive coils 402 and 404 may share a common area on an integrated circuit where the LNA circuit 104 is formed, which saves valuable real estate. It is understood, however, that various numbers of conductive coils are within the scope of the present disclosure.

In some embodiments, each conductive coil is formed of a metal material and/or a polycrystalline (e.g., silicon) material. It is understood, however, that other conductive materials may be utilized in accordance with various embodiments. Additionally or alternatively, each conductive coil may be formed as terminal connections that are overlaid in part by routing a conductive material (e.g., a metal material and/or a polycrystalline silicon material) in a loop and/or up or down through plural integrated circuit layers.

In an embodiment, a low noise amplifier (LNA) is disclosed. The LNA includes a first transistor, having a first type, and configured to provide a first transconductance; and a second transistor, having a second type being different from the first type, and configured to provide a second transconductance, wherein the LNA is configured to use a sum of the first and second transconductances to amplify an input signal.

In another embodiment, an LNA includes a first pair of transistors with a first type, each configured to provide a first transconductance; a second pair of transistors with a second type being different from the first type, each configured to provide a second transconductance; a first pair of coupling capacitors, cross-coupled between the first pair of transistors, and configured to provide a first boosting coefficient to the first transconductance; and a second pair of coupling capacitors, cross-coupled between the second pair of transistors, and configured to provide a second boosting coefficient to the second transconductance, wherein the LNA is configured to use a boosted effective transconductance based on the first and second boosting coefficients, and the first and second transconductances to amplify an input signal.

Yet in another embodiment, an LNA includes a pair of n-type transistors, each configured to provide a first transconductance; a pair of p-type transistors, each configured to provide a second transconductance; a first pair of coupling capacitors, cross-coupled between the pair of n-type transistors, and configured to provide a first boosting coefficient to the first transconductance; and a second pair of coupling capacitors, cross-coupled between the pair of p-type transistors, and configured to provide a second boosting coefficient to the second transconductance, wherein the LNA is configured to use a boosted effective transconductance based on the first and second boosting coefficients, and the first and second transconductances to amplify an input signal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A low noise amplifier (LNA), comprising:
   a first transistor configured to provide a first transconductance; and
   a second transistor configured to provide a second transconductance; and
   a common-mode feedback circuit (CMFC) coupled to respective drains of the first and second transistors, wherein the common-mode feedback circuit comprises:
   an amplifier;
   a first resistor having a first end coupled to a first input of the amplifier and a second end, opposite the first end, coupled to the drain of the first transistor, wherein an output of the amplifier is coupled to respective gates of the first and second transistors; and
   a second resistor having a third end coupled to the first input of the amplifier and a fourth end, opposite the third end, coupled to the drain of the second transistor.

2. The LNA of claim 1, wherein the first and second transistors are each a p-type metal-oxide-semiconductor field-effect-transistor (MOSFET).

3. The LNA of claim 1, further comprising:
   a third transistor having a drain coupled to the CMFC; and
   a fourth transistor having a drain coupled to the CMFC.

4. The LNA of claim 3, wherein the third and fourth transistors are each an n-type MOSFET.

5. The LNA of claim 1, further comprising:
   a first inductor coupled between source ends of the third and fourth transistors and ground; and a second inductor coupled between source ends of the first and second transistors and a supplied voltage of the LNA.

6. The LNA of claim 5, wherein the first and second inductors comprise first and second conductive coils, respectively, and wherein the first and second conductive coils share a common lumen and are interleaved with each other.

7. The LNA of claim 5, wherein respective drain ends of the first and second transistors are coupled to a common node.

8. The LNA of claim 1, wherein the common-mode feedback circuit is configured to provide a stable voltage to the drain end of the second transistor.

9. The LNA of claim 1, wherein the LNA is configured to use a sum of the first and second transconductances to amplify an input signal, and wherein respective source ends of the first and second transistors are coupled to a blocking capacitor.

10. A low noise amplifier (LNA), comprising:
a first pair of transistors each configured to provide a first transconductance;
a second pair of transistors each configured to provide a second transconductance;
a first inductor coupled between source ends of the first pair of transistors;
a second inductor coupled between source ends of the second pair of transistors;
a first blocking capacitor coupled between a source end of a first transistor of the first pair of transistors and a source end of a first transistor of the second pair of transistors; and
a second blocking capacitor coupled between a source end of a second transistor of the first pair of transistors and a source end of a second transistor of the second pair of transistors,
wherein the LNA is configured to use a sum of the first and second transconductances to amplify an input signal.

11. The LNA of claim 10, wherein the LNA provides a boosted effective transconductance that is about twice a sum of the first and second transconductances.

12. The LNA of claim 10, wherein first and second boosting coefficients are each about two.

13. The LNA of claim 10, further comprising:
a first pair of coupling capacitors configured to provide a first boosting coefficient to the first transconductance; and
a second pair of coupling capacitors, cross-coupled between the second pair of transistors, and configured to provide a second boosting coefficient to the second transconductance,
wherein the LNA is configured to use a boosted effective transconductance based on the first and second boosting coefficients, and the first and second transconductances to amplify an input signal.

14. The LNA of claim 13, further comprising:
a common-mode feedback circuit comprising a first resistor and a second resistor, wherein a first end of the first resistor is coupled to a gate of a first transistor of the second pair of transistors and a second end of the first resistor is coupled to a drain of the first transistor of the second pair of transistors, and a first end of the second resistor is coupled to the gate of the first transistor and a second end of the second resistor, opposite the first end of second resistor, is coupled to a drain of a second transistor of the second pair of transistors.

15. A low noise amplifier (LNA), comprising:
a pair of n-type transistors, each configured to provide a first transconductance;
a pair of p-type transistors, each configured to provide a second transconductance; and
a common-mode feedback circuit comprising a first resistor and a second resistor, wherein a first end of the first resistor is coupled to a gate of a first transistor of the pair of p-type transistors and a second end of the first resistor is coupled to a drain of the first transistor of the pair of p-type transistors, and a first end of the second resistor is coupled to the gate of the first transistor of the pair of p-type transistors and a second end of the second resistor, opposite the first end of second resistor, is coupled to a drain of a second transistor of the-pair of p-type transistors;
a first inductor coupled between source ends of the pair of n-type transistors; and
a second inductor coupled between source ends of the pair of p-type transistors.

16. The LNA of claim 15, wherein the first and second inductors are each formed as a first conductive coil and a second conductive coil, respectively, and the first and second conductive coils are interleaved with each other.

17. The LNA of claim 16, further comprising:
a first blocking capacitor coupled between a source end of a first transistor of the pair of n-type transistors and a source end of the first transistor of the pair of p-type transistors.

18. The LNA of claim 16, further comprising:
a second blocking capacitor coupled between a source end of a second transistor of the pair of n-type transistors and a source end of a second transistor of the pair of p-type transistors.

19. The LNA of claim 18, wherein the first and second boosting coefficients are each about two.

20. The LNA of claim 15, wherein the common-mode feedback circuit is configured to provide a stable voltage to the drain end of the second transistor of the pair of p-type transistors.

* * * * *